United States Patent
Huang

(10) Patent No.: US 12,125,192 B2
(45) Date of Patent: Oct. 22, 2024

(54) ARTICLE DETECTION DEVICE, ARTICLE DETECTION METHOD, AND STORAGE MEDIUM

(71) Applicant: HON HAI PRECISION INDUSTRY CO., LTD., New Taipei (TW)

(72) Inventor: Ying-Tien Huang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 764 days.

(21) Appl. No.: 17/322,210

(22) Filed: May 17, 2021

(65) Prior Publication Data

US 2021/0383522 A1    Dec. 9, 2021

(30) Foreign Application Priority Data

Jun. 3, 2020   (CN) .......................... 202010495931.9

(51) Int. Cl.
G06T 7/00   (2017.01)
H01L 21/67  (2006.01)

(52) U.S. Cl.
CPC ........ G06T 7/001 (2013.01); H01L 21/67265 (2013.01); *G06T 2207/20081* (2013.01); *G06T 2207/20084* (2013.01); *G06T 2207/30148* (2013.01)

(58) Field of Classification Search
CPC .......... G06T 7/001; G06T 2207/20081; G06T 2207/20084; G06T 2207/30148; H01L 21/67265
See application file for complete search history.

(56) References Cited

U.S. PATENT DOCUMENTS

| | | | |
|---|---|---|---|
| 6,147,356 A * | 11/2000 | Hahn | H01L 21/681 250/559.3 |
| 6,452,503 B1 * | 9/2002 | Weiss | H01L 21/67265 414/935 |
| 2002/0130250 A1 * | 9/2002 | Chung | H01L 21/67265 250/221 |
| 2005/0035313 A1 * | 2/2005 | Garssen | H01L 21/67265 250/559.33 |
| 2007/0118300 A1 * | 5/2007 | Mollenkopf | H01L 21/67265 702/33 |
| 2014/0277690 A1 * | 9/2014 | Yoshida | H01L 21/67265 700/214 |
| 2019/0012548 A1 * | 1/2019 | Levi | G06T 7/73 |
| 2020/0006050 A1 * | 1/2020 | Houng | H01L 21/67207 |
| 2020/0066036 A1 * | 2/2020 | Choi | G06T 17/10 |
| 2023/0410551 A1 * | 12/2023 | Hillmann | G06V 40/1324 |

FOREIGN PATENT DOCUMENTS

| | | |
|---|---|---|
| CN | 109583392 A | 4/2019 |
| CN | 110931409 A | 3/2020 |
| CN | 111127327 A | 5/2020 |
| CN | 111127558 A | 5/2020 |
| TW | I475601 B | 3/2015 |

\* cited by examiner

*Primary Examiner* — Kyle O Logan
(74) *Attorney, Agent, or Firm* — ScienBiziP, P.C.

(57) ABSTRACT

An article detection method applied to an article detection device is provided. The method includes controlling at least one lighting device to emit a light beam towards a carrier. Once at least one camera is controlled to capture at least one image of the carrier; and a placement situation of articles in the carrier is detected based on the captured image using an article detection model.

12 Claims, 4 Drawing Sheets

ARTICLE DETECTION DEVICE, ARTICLE DETECTION METHOD, AND STORAGE MEDIUM

FIELD

The present disclosure relates to computing technology, in particular to an article detection device, an article detection method, and a readable storage medium.

BACKGROUND

Generally, when a wafer is placed on a wafer carrier such as a wafer cassette box or a wafer shipping box manually or by a robotic arm, there is a risk that the wafer is tilted. An operator can observe whether the wafer is tilted or not by visual inspection. However, visual inspections may not be reliable.

DETAILED DESCRIPTION

In order to provide a more clear understanding of the objects, features, and advantages of the present disclosure, the same are given with reference to the drawings and specific embodiments. It should be noted that the embodiments in the present disclosure and the features in the embodiments may be combined with each other without conflict.

In the following description, numerous specific details are set forth in order to provide a full understanding of the present disclosure. The present disclosure may be practiced otherwise than as described herein. The following specific embodiments are not to limit the scope of the present disclosure.

Unless defined otherwise, all technical and scientific terms herein have the same meaning as used in the field of the art technology as generally understood. The terms used in the present disclosure are for the purposes of describing particular embodiments and are not intended to limit the present disclosure.

Figure 1:
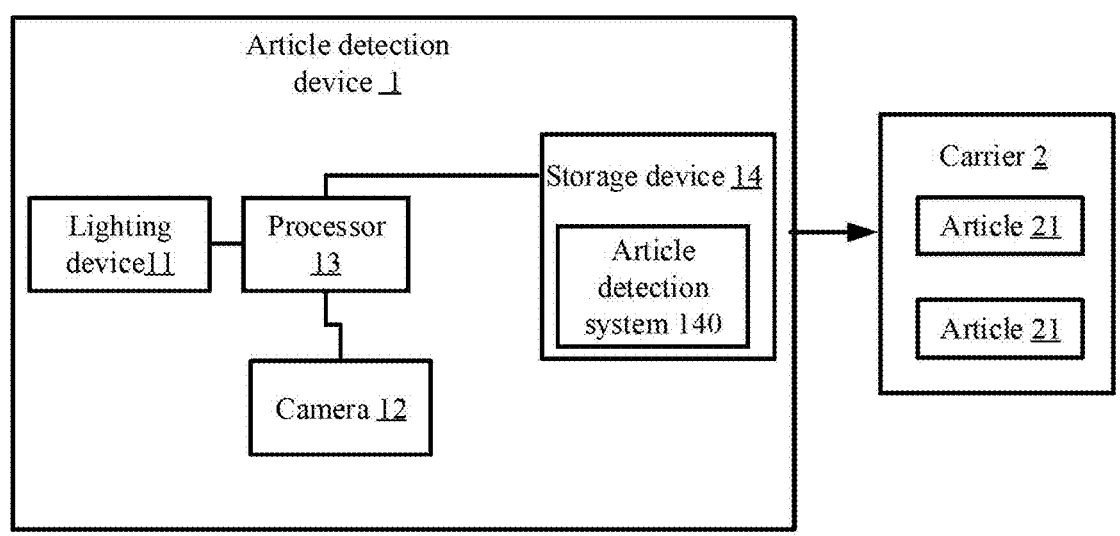
FIG. 1 illustrates a schematic diagram of an article detection device according to one embodiment of the present disclosure.

FIG. 1 illustrates a structural diagram of an article detection device provided by a preferred embodiment of the present disclosure.

In one embodiment, the article detection device 1 includes, but is not limited to, at least one lighting device 11, at least one camera 12, at least one processor 13, and a storage device 14. In this embodiment, the at least one processor 13 is electrically connected to the at least one lighting device 11, the at least one camera 12, and the storage device 14.

It should be noted that FIG. 1 is only an example of the article detection device 1 of the embodiment of the present disclosure, and should not be construed as a limitation of the present disclosure. The article detection device 1 may include more or fewer elements than those shown in FIG. 1. For example, the article detection device 1 may also include an operating system, a communication module, and the like.

In this embodiment, the article detection device 1 is used to detect a placement situation of one or more articles 21 carried by a carrier 2. For example, the article detection device 1 detects whether the one or more articles 21 are correctly placed or placed obliquely on the carrier 2.

In one embodiment, the one or more articles 21 may be regular items, for example, the one or more articles 21 can be wafers having the same shape. For example, the one or more articles 21 can be wafers each of which having the same circular shape. The one or more articles 21 can be other products having the same shape. For example, the one or more articles 21 can be motherboards having the same square shape. The one or more articles 21 are regularly arranged on the carrier 2. In this embodiment, the carrier 2 is used to carry the one or more articles 21. For example, the carrier 2 is a wafer cassette box or a wafer shipping box that can accommodate one or more wafers.

It should be noted that wafers refer to silicon wafers used in the production of silicon semiconductor integrated circuits. Because of their circular shape, they are called wafers.

In this embodiment, the article detection device 1 may be a computer device, and the at least one lighting device 11 and the at least one camera 12 may be externally configured in the computer device, i.e., the at least one lighting device 11 and the at least one camera 12 may be externally connected with the computer device. The at least one processor 13 and the storage device 14 may be internally configured in the computer device.

In an embodiment, the at least one light device 11 may be a light-emitting diode (LED) device. The at least one camera 12 may be a high-definition camera.

In one embodiment, the at least one lighting device 11 and the at least one camera 12 are arranged on opposite sides of the carrier 2. The at least one lighting device 11 is used to emit a light beam towards the carrier 2. The at least one camera 12 is used to capture images of the carrier 2.

To clearly illustrate the present disclosure, in this embodiment, the carrier 2 is a wafer cassette box configured to accommodate one or more wafers and the one or more articles 21 are wafers.

Figure 2:
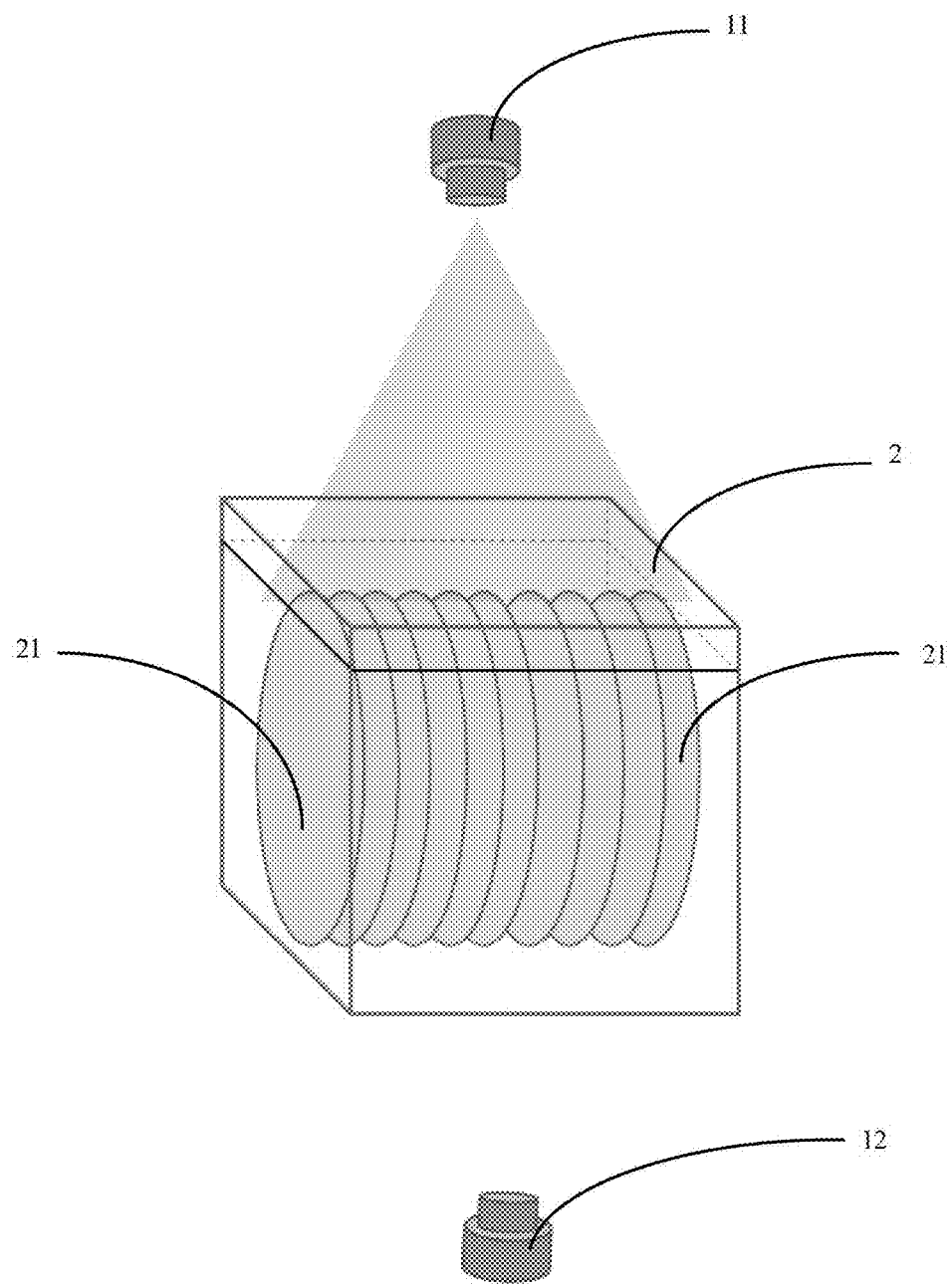
FIG. 2 illustrates a position of a lighting device and a position of a camera according to an embodiment of the present disclosure.

Please also refer to FIG. 2. In one embodiment, the at least one lighting device 11 is positioned above the carrier 2, and the at least one camera 12 is positioned below the carrier 2. In other embodiments, the at least one lighting device 11 and the at least one camera 12 may be respectively positioned on the left side and the right side of the carrier 2.

In some embodiments, the storage device 14 may be used to store program codes and various data of computer programs. For example, the storage device 14 may be used to store an article detection system 40 installed in the article detection device 1 and implement completion of storing programs or data during an operation of the article detection device 1. The storage device 14 may include Read-Only Memory (ROM), Programmable Read-Only Memory (PROM), and Erasable Programmable Read-Only Memory. EPROM), One-time Programmable Read-Only Memory (OTPROM), Electronically-Erasable Programmable Read-Only Memory (EEPROM), Compact Disc (Compact Disc) Read-Only Memory (CD-ROM) or other optical disk storage, disk storage, magnetic tape storage, or any other non-transitory computer-readable storage medium that can be used to carry or store data.

In some embodiments, the at least one processor 13 may be composed of an integrated circuit. For example, the at least one processor 13 can be composed of a single packaged integrated circuit or can be composed of multiple packaged integrated circuits with the same function or different function. The at least one processor 13 includes one or more central processing units (CPUs), one or more microprocessors, one or more digital processing chips, one or more graphics processors, and various control chips. The at least one processor 13 is a control unit of the article detection device 1. The at least one processor 13 uses various interfaces and lines to connect various components of the article detection device 1, and executes programs or modules or instructions stored in the storage device 13, and invokes data stored in the storage device 13 to perform various functions of the article detection device 1 and to process data, for example, by executing the article detection system 40 to detect the placement situation of the articles 21 in the carrier 2 such as whether articles 21 are placed at an angle. For details, see the description of FIG. 4.

In an embodiment, the processor 13 can control the at least one lighting device 11 to emit a light beam towards the carrier 2. The processor 13 also controls the at least one camera 12 to capture images of the carrier 2 when the processor 13 controls the at least one lighting device 11 to emit light beams to the carrier 2. The processor 13 can detect the placement situation of the one or more articles 21 in the carrier 2 based on the captured images using a pre-trained article detection model. For example, the processor 13 can detect whether there is at least one article 21 placed obliquely in the carrier 2.

In one embodiment, the processor 13 may pre-train the article detection model, and store the pre-trained article detection model in the storage device 14, so that when there is need to detect the placement situation of the articles 21 in the carrier 2, the processor 13 can realize the detection of the placement situation of articles 21 in the carrier 2 by call the article detection model from the storage device 14, and detecting the placement situation of articles 21 in the carrier 2 using the pre-trained article detection model based on the image captured by the camera 12.

In an embodiment, the method for training the article detection model includes (a1)-(a3):

(a1) Obtain a preset number of images corresponding to different placement situations, label the preset number of images according to the different placement situations and obtain labeled preset number of images, such that the images corresponding to different placement situations having different labels; set the labeled preset number of images as training samples.

In this embodiment, the different placement situations include a first placement situation and a second placement situation. The first placement situation indicates each article 21 in the carrier 2 is correctly placed. The second placement situation indicates that at least one article 21 in the carrier 2 is placed obliquely. In other words, the images of the preset number of images that are corresponding to first placement situation are captured when each article 21 in the carrier 2 is correctly placed, and the images of the preset number of images that are corresponding to the second placement situation are captured when at least one article 21 in the carrier 2 is placed obliquely.

It should be noted that the correct placement of the article 21 is relative to the oblique placement, that is, the article 21 being correctly placed in the carrier 2 means that the article 21 is not placed at an angle, or the article 21 being correctly placed means that the article 21 is placed in accordance with a placement requirements or a placement standards for the article 21.

Specifically, it assumed that the preset number of images corresponding to different placement situations includes 1000 images, and 500 images corresponding to the first placement situation and are labeled as "1", that is, with "1" as a label. Similarly, 500 images corresponding to the second placement situation are labeled as "2", that is, "2" is used as a label. After the 1000 images are labeled, the labeled 1000 images are used as training samples.

In this embodiment, the preset number of images may be obtained by the at least one camera 12 or other shooting device by shooting the carrier 2 from below of the carrier 2 when the at least one lighting device 11 emits a light beam towards the carrier 2 from above of the carrier 2.

Of course, in other embodiments, when the at least one lighting device 11 is positioned on a left side of the carrier 2 and the at least one camera 12 is positioned on a right side of the carrier 2, each of the preset number of images can be obtained by the at least one camera 12 by shooting the carrier 2 from the right side of the carrier 2 when the at least one lighting device 11 emits a light beam towards the carrier 2 from the left side of the carrier 2. When the at least one lighting device 11 is positioned on the right side of the carrier 2 and the at least one camera 12 is positioned on the left side of the carrier 2, each of the preset number of images can be obtained by the at least one camera 12 by shooting the carrier 2 from the left side of the carrier 2 when the at least one lighting device 11 emits a light beam towards the carrier 2 from the right side of the carrier 2.

(a2) Randomly divide the training sample into a training set and a verification set, train a deep neural network to obtain the article detection model use the training set, and verify an accuracy of the article detection model using the verification set. For example, the processor 13 can first distribute the images corresponding to different placement situations to different folders according to the labels. For example, the images corresponding to the first placement situation are distributed to a first folder, and the images corresponding to the second placement situation are distributed to a second folder. Then the processor 13 can extract a first preset ratio (for example, 70%) images from the first folder and extract images the first preset ratio images from the second folder. The processor 13 can set the extracted images as the training set, and use the training set to train the deep neural network to obtain the article detection model. The processor can take remaining images from the first folder and the second folder as the verification set, and use the article detection model to detect each image of the verification set, and calculate the accuracy rate of the article detection model based on a detection result of the article detection model detecting the each image of the verification set.

In one embodiment, the deep neural network includes an input layer, a convolutional layer, a pooling layer, and a fully connected layer. The input layer inputs an image, and the convolutional layer extracts image features and outputs a feature vector. The pooling layer compresses the feature vector to extract main features. The fully connected layer connects all the features and sends an output value to a classifier (such as a softmax classifier).

(a3) If the accuracy rate is greater than or equal to a preset accuracy rate, then the training ends; if the accuracy rate is less than the preset accuracy rate, increase the number of training samples and retrain the deep neural network until the accuracy rate of the article detection model that is re-obtained is greater than or equal to the preset accuracy rate.

In this embodiment, the article detection system 140 can include one or more modules. The one or more modules are stored in the storage device 31 and are executed by at least one processor (e.g., processor 32 in this embodiment), such that a function of processing files (for details, see the introduction to FIG. 3 below) is achieved.

Figure 3:
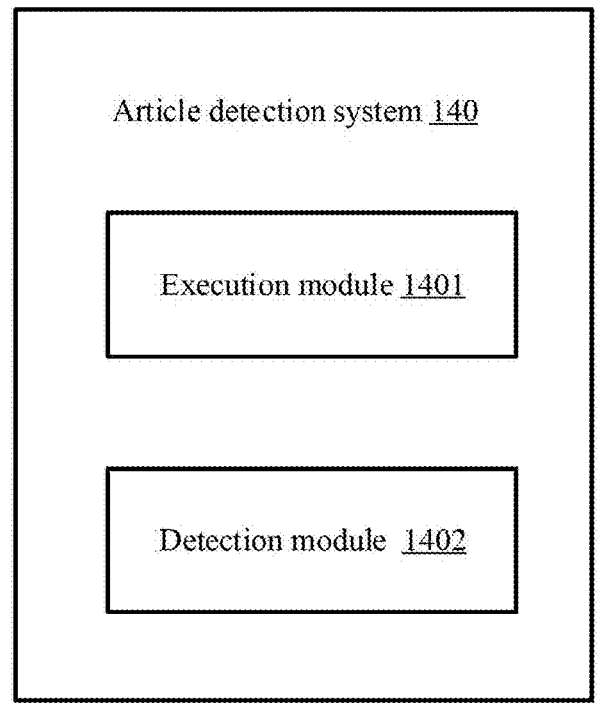
FIG. 3 shows one embodiment of modules of an article detection system of the present disclosure.

Referring to FIG. 3, in this embodiment, the article detection system 140 may include a plurality of modules composed of program code segments. The program code of each program segment in the article detection system 140 can be stored in the storage device 14 of the article detection device 1 and executed by the at least one processor 13 to realize the detection of the placement situation of the one or more articles 21 in the carrier 2.

In this embodiment, the article detection system 140 can be divided into the plurality of modules according to the functions it performs. The plurality of modules may include: an execution module 1401 and a detection module 1402. The module referred to in the present disclosure refers to a series of computer program segments that can be executed by at least one processor (for example, the processor 13) and can complete fixed functions, and are stored in the storage device 14. Each of the above-mentioned modules includes several instructions for executing the at least one processor 13 so as to realize the function of detecting the placement situation of the one or more articles 21 in the carrier 2 according to the various embodiments of the present disclosure. The function of each module will be detailed in conjunction with FIG. 4.

Figure 4:
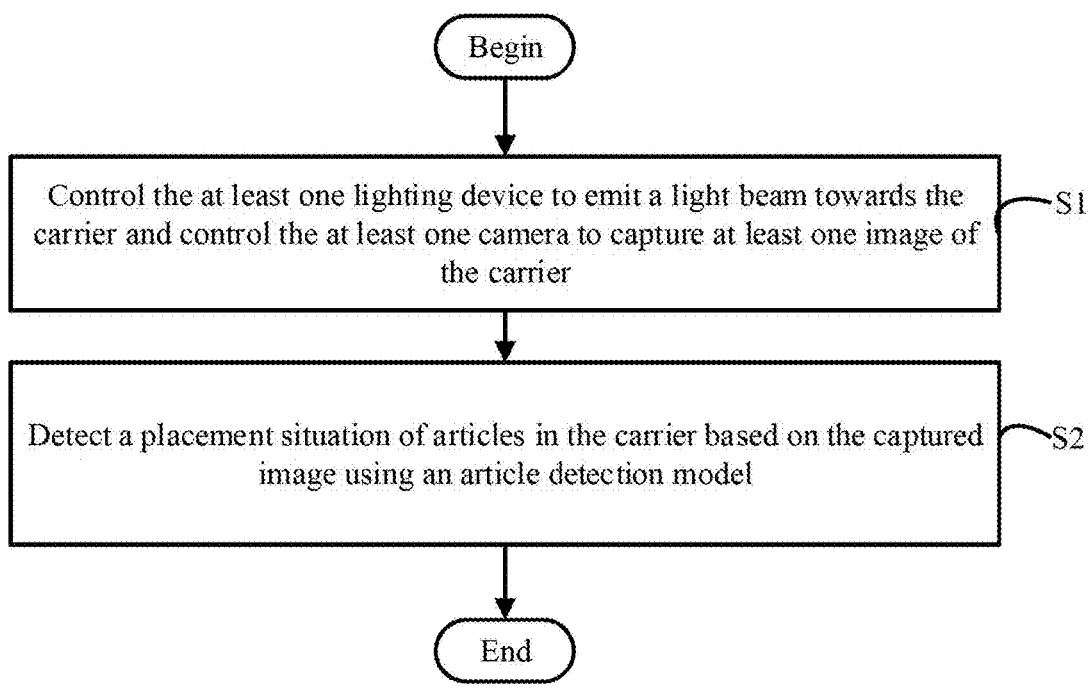
FIG. 4 shows a flow chart of one embodiment of an article detection method of the present disclosure.

FIG. 4 is a flowchart of an article detection method according to a preferred embodiment of the present disclosure.

In this embodiment, the article detection method can be applied to the article detection device 1. For the article detection device 1 that requires detecting the placement situation of the one or more articles 21 in the carrier 2, the article detection device 1 can be directly integrated with the function of detecting the placement situation of the one or more articles 21 in the carrier 2. The article detection device 1 can also achieve the function of detecting the placement situation of the one or more articles 21 in the carrier 2 by running a Software Development Kit (SDK).

FIG. 4 shows a flow chart of one embodiment of an article detection method. Referring to FIG. 4, the method is provided by way of example, as there are a variety of ways to carry out the method. The method described below can be carried out using the configurations illustrated in FIG. 1, for example, and various elements of these figures are referenced in explanation of method. Each block shown in FIG. 4 represents one or more processes, methods, or subroutines, carried out in the method. Furthermore, the illustrated order of blocks is illustrative only and the order of the blocks can be changed. Additional blocks can be added or fewer blocks can be utilized without departing from this disclosure. The example method can begin at block S1.

At block S1, the execution module 1401 controls the at least one lighting device 11 to emit a light beam towards the carrier 2. The execution module 1401 also controls the at least one camera 12 to capture an image of the carrier 2 when the at least one lighting device 11 emits the light beam towards the carrier 2.

Block S2, the detection module 1402 invokes the pre-trained article detection model to detect the placement situation of the articles 21 in the carrier 2 based on the captured image.

Specifically, the detection module 1402 inputs the captured image into the article detection model to obtain the placement situation of the articles 21 in the carrier 2.

In an embodiment, the detection module 1402 trains the article detection model includes (a1)-(a3):

(a1) Obtain a preset number of images corresponding to different placement situations, label the preset number of images according to the different placement situations and obtain labeled preset number of images, such that the images corresponding to different placement situations having different labels; set the labeled preset number of images as training samples.

In this embodiment, the different placement situations include a first placement situation and a second placement situation. The first placement situation indicates each article 21 in the carrier 2 is correctly placed. The second placement situation indicates that at least one article 21 in the carrier 2 is placed obliquely. In other words, the images of the preset number of images that are corresponding to first placement situation are captured when each article 21 in the carrier 2 is correctly placed, and the images of the preset number of images that are corresponding to the second placement situation are captured when at least one article 21 in the carrier 2 is placed obliquely.

It should be noted that the correct placement of the article 21 is relative to the oblique placement, that is, the article 21 being correctly placed in the carrier 2 means that the article 21 is not placed at an angle, or the article 21 being correctly placed means that the article 21 is placed in accordance with placement requirements or placement standards for the article 21.

Specifically, it assumed that the preset number of images corresponding to different placement situations includes 1000 images, and 500 images corresponding to the first placement situation and are labeled as "1", that is, with "1" as a label. Similarly, 500 images corresponding to the second placement situation are labeled as "2", that is, "2" is used as a label. After the 1000 images are labeled, the labeled 1000 images are used as training samples.

In this embodiment, the preset number of images may be obtained by the at least one camera 12 or other shooting device by shooting the carrier 2 from below of the carrier 2 when the at least one lighting device 11 emits a light beam towards the carrier 2 from above of the carrier 2.

Of course, in other embodiments, when the at least one lighting device 11 is positioned on a left side of the carrier 2 and the at least one camera 12 is positioned on a right side of the carrier 2, each of the preset number of images can be obtained by the at least one camera 12 by shooting the carrier 2 from the right side of the carrier 2 when the at least one lighting device 11 emits a light beam towards the carrier 2 from the left side of the carrier 2. When the at least one lighting device 11 is positioned on the right side of the carrier 2 and the at least one camera 12 is positioned on the left side of the carrier 2, each of the preset number of images can be obtained by the at least one camera 12 by shooting the carrier 2 from the left side of the carrier 2 when the at least one lighting device 11 emits a light beam towards the carrier 2 from the right side of the carrier 2.

(a2) Randomly divide the training samples into a training set and a verification set, train a deep neural network to obtain the article detection model use the training set, and verify an accuracy of the article detection model using the verification set. For example, the processor 13 can first distribute the images corresponding to different placement situations to different folders according to the labels. For example, the images corresponding to the first placement situation are distributed to a first folder, and the images corresponding to the second placement situation are distributed to a second folder. Then the processor 13 can extract a first preset ratio (for example, 70%) images from the first folder and extract images the first preset ratio images from the second folder. The processor 13 can set the extracted images as the training set, and use the training set to train the deep neural network to obtain the article detection model. The processor can take remaining images from the first folder and the second folder as the verification set, and use the article detection model to detect each image of the verification set, and calculate the accuracy rate of the article detection model based on a detection result of the article detection model detecting the each image of the verification set.

In one embodiment, the deep neural network includes an input layer, a convolutional layer, a pooling layer, and a fully connected layer. The input layer inputs an image, and the convolutional layer extracts image features and outputs a feature vector. The pooling layer compresses the feature vector to extract main features. The fully connected layer connects all the features and sends an output value to a classifier (such as a softmax classifier).

(a3) If the accuracy rate is greater than or equal to a preset accuracy rate, then the training ends; if the accuracy rate is less than the preset accuracy rate, increase the number of images i.e., the training samples and retrain the deep neural network until the accuracy rate of the article detection model that is re-obtained is greater than or equal to the preset accuracy rate.

The above description is only embodiments of the present disclosure, and is not intended to limit the present disclosure, and various modifications and changes can be made to the present disclosure. Any modifications, equivalent substitutions, improvements, etc. made within the spirit and scope of the present disclosure are intended to be included within the scope of the present disclosure.

What is claimed is:

1. An article detection device, comprising:
   at least one lighting device;
   at least one camera, the at least one lighting device and the at least one camera being set on opposite sides of a carrier;
   a storage device;
   at least one processor;
   the storage device storing one or more programs, which when executed by the at least one processor, cause the at least one processor to:
   control the at least one lighting device to emit a light beam towards the carrier and control the at least one camera to capture at least one image of the carrier; and
   detect a placement situation of articles in the carrier based on the captured image by an article detection model, the article detection model being trained using a preset number of images corresponding to different placement situations.

2. The article detection device according to claim 1, wherein the processor is further caused to:
   train the article detection model using the preset number of images corresponding to different placement situations, comprising:
      obtaining the preset number of images corresponding to different placement situations;
      labeling the preset number of images according to the different placement situations;
      obtaining labeled preset number of images;
      setting the labeled preset number of images as training samples;
      randomly dividing the training samples into a training set and a verification set;
      obtaining the article detection model by training a deep neural network using the training set;
      verifying an accuracy of the article detection model using the verification set;
      ending a training of the deep neural network if the accuracy rate is greater than or equal to a preset accuracy rate; and
      increasing the number of images if the accuracy rate is less than the preset accuracy rate, and retraining the deep neural network until the accuracy rate of the article detection model is greater than or equal to the preset accuracy rate.

3. The article detection device according to claim 2, wherein the different placement situations comprise a first placement situation and a second placement situation, the first placement situation indicates each article in the carrier is correctly placed, and the second placement situation indicates that at least one article in the carrier is placed obliquely.

4. The article detection device according to claim 1, wherein the at least one lighting device is positioned above the carrier, and the at least one camera is positioned below the carrier; or the at least one lighting device and the at least one camera are respectively positioned on a left side and a right side of the carrier.

5. The article detection device according to claim 1, wherein each of the articles in the carrier has a same shape.

6. The article detection device according to claim 5, wherein the carrier is a wafer cassette box configured to accommodate wafers.

7. An article detection method applied to an article detection device, which comprises at least one lighting device and at least one camera, the at least one lighting device and the at least one camera being set on opposite sides of a carrier, wherein the method comprises:
   controlling the at least one lighting device to emit a light beam towards the carrier and controlling the at least one camera to capture at least one image of the carrier; and
   detecting a placement situation of articles in the carrier based on the captured image using an article detection model, the article detection model being trained using a preset number of images corresponding to different placement situations.

8. The article detection method according to the claim 7, further comprising:
   training the article detection model using the preset number of images corresponding to different placement situations, comprising:
   obtaining the preset number of images corresponding to different placement situations; labeling the preset number of images according to the different placement situations and obtaining labeled preset number of images; setting the labeled preset number of images as training samples; randomly dividing the training samples into a training set and a verification set, obtaining the article detection model by training a deep neural network using the training set; and verifying an accuracy of the article detection model using the verification set; ending a training of the deep neural network if the accuracy rate is greater than or equal to a preset accuracy rate; increasing the number of images if the accuracy rate is less than the preset accuracy rate, and retraining the deep neural network until the accuracy rate of the article detection model is greater than or equal to the preset accuracy rate.

9. The article detection method according to the claim 8, wherein the different placement situations comprise a first placement situation and a second placement situation, the first placement situation indicates each article in the carrier is correctly placed, and the second placement situation indicates that at least one article in the carrier is placed obliquely.

10. A non-transitory storage medium having instructions stored thereon, the instructions being executed by a processor of an article detection device, which comprises at least one lighting device and at least one camera, the at least one lighting device and the at least one camera being set on opposite sides of a carrier; wherein the instructions cause the processor to perform an article detection method, which comprises:

controlling the at least one lighting device to emit a light beam towards the carrier and controlling the at least one camera to capture at least one image of the carrier; and detecting a placement situation of articles in the carrier based on the captured image using an article detection model, the article detection model being trained using a preset number of images corresponding to different placement situations.

11. The non-transitory storage medium according to the claim 10, wherein the method further comprises:

training the article detection model using the preset number of images corresponding to different placement situations, comprising:

obtaining the preset number of images corresponding to different placement situations; labeling the preset number of images according to the different placement situations and obtaining labeled preset number of images; setting the labeled preset number of images as training samples; randomly dividing the training samples into a training set and a verification set; obtaining the article detection model by training a deep neural network using the training set; and verifying an accuracy of the article detection model using the verification set; ending a training of the deep neural network if the accuracy rate is greater than or equal to a preset accuracy rate; increasing the number of images if the accuracy rate is less than the preset accuracy rate, and retraining the deep neural network until the accuracy rate of the article detection model is greater than or equal to the preset accuracy rate.

12. The non-transitory storage medium according to the claim 11, wherein the different placement situations comprise a first placement situation and a second placement situation, the first placement situation indicates each article in the carrier is correctly placed, and the second placement situation indicates that at least one article in the carrier is placed obliquely.

* * * * *